United States Patent [19]

Ng et al.

[11] Patent Number: 5,134,447
[45] Date of Patent: Jul. 28, 1992

[54] NEUTRAL IMPURITIES TO INCREASE LIFETIME OF OPERATION OF SEMICONDUCTOR DEVICES

[75] Inventors: Kwok K. Ng, Berkeley Heights; Chien-Shing Pai, Bridgewater, both of N.J.

[73] Assignee: AT&T Bell Laboratories, Murray Hill, N.J.

[21] Appl. No.: 574,564

[22] Filed: Aug. 27, 1990

Related U.S. Application Data

[63] Continuation of Ser. No. 411,061, Sep. 22, 1989, abandoned.

[51] Int. Cl.[5] ............................................. H01L 29/10
[52] U.S. Cl. ................................. 357/23.4; 357/23.3; 357/23.8; 357/20; 357/63
[58] Field of Search ................... 437/24, 27; 357/23.1, 357/23.8, 20, 23.3, 63

[56] References Cited

U.S. PATENT DOCUMENTS

| | | | |
|---|---|---|---|
| 4,613,882 | 9/1986 | Pimbley et al. | 357/23.8 |
| 4,636,822 | 1/1987 | Codella et al. | 357/22 |
| 4,680,603 | 7/1987 | Wei et al. | 357/20 |
| 4,683,645 | 8/1987 | Naguib et al. | 357/63 |
| 4,835,112 | 5/1989 | Pfiester et al. | 357/23.1 |
| 4,837,173 | 6/1989 | Alvis et al. | 437/27 |
| 4,843,023 | 6/1989 | Chiu et al. | 357/23.3 |

OTHER PUBLICATIONS

*IEEE Transactions on Electron Devices*, vol. 35, No. 5, May 1988, "Optimization of the Germanium Preamorphization Conditions for Shallow-Junction Formation", M. C. Ozturk et al, pp. 659-668.
*Appl. Phys. Lett.*, vol. 52(12), Mar. 21, 1988, "Very Shallow $p^+-n$ Junction Formation by low-energy $BF_2^+$ Ion Implantation Into Crystalline and Germanium Preamorphized Silicon", by M. C. Ozturk et al, pp. 963-965.
*Appl. Phys. Lett*, vol. 52(4), Jan. 25, 1988, "Electrical Properties of Shallow $p^+-n$ Junctions Formed by $BF_2$ Ion Implantation in Germanium Preamorphized Silicon", by M. C. Ozturk et al, pp. 281-283.
*Appl. Phys. Lett*, vol. 51(15), Oct. 12, 1987, "Defect Annihilation in Shallow $p^+$ Junctions Using Titanium Silicide", D. S. Wen et al, pp. 1269-1271.
*Appl. Phys. Lett.*, vol. 49(19), Nov. 10, 1986, "Elimination of End-of-range and Mask Edge Lateral Damage in Ge+ Preamorphized, B+ Implanted Si", A. C. Ajmera et al, pp. 1269-1271.
*IEEE Electron Device Letters*, vol. 9, No. 7, Jul. 1988, "Improved MOSFET Short-Channel Device Using Germanium Implantation", James R. Pfiester, et al, pp. 343-346.
*IEEE* CH2515-5/87/0000-0740, 1987, "Novel Germanium/Boron Channel-Stop Implantation for Submicron CMOS", J. R. Pfiester et al, pp. 740-743.

*Primary Examiner*—Edward J. Wojciechowicz
*Attorney, Agent, or Firm*—David I. Caplan

[57] ABSTRACT

In order to reduce the rate of (hot charge-carrier) degradation of semiconductor devices formed in a semiconductor body, a neutral impurity—such as germanium in silicon MOS transistors—is introduced into the body in a neighborhood of an intersection of a p-n junction with a surface of the body.

9 Claims, 1 Drawing Sheet

NEUTRAL IMPURITIES TO INCREASE LIFETIME OF OPERATION OF SEMICONDUCTOR DEVICES

This is a continuation of application Ser. No. 411,061, filed on Sep. 22, 1989, now abandoned.

TECHNICAL FIELD

This invention relates to semiconductor devices and more particularly to transistor device structures in integrated circuits and to methods for making such structures.

BACKGROUND OF THE INVENTION

It is known in the art that semiconductor devices, particularly both bipolar and MOS (metal oxide semiconductor) transistor devices, tend to degrade with use. That is, for example, the transconductances $G_M$ of these devices undesirably continue to decrease after continued operation in the circuits. More specifically, for a given MOS transistor, a higher drain-to-source voltage $V_{DS}$ causes a higher rate of undesirable reduction of $G_M$ and hence a lower lifetime of useful operation (operational lifetime) of the transistor.

Each such device subject to this degradation is incorporated in a semiconductor body, typically silicon; and the device comprises a p-n junction, formed by the interface of two regions of the semiconductor body, one of the regions having a relatively high concentration of (conductivity-type determining) donor or acceptor impurities, the other having a relatively low concentration of acceptor or donor impurities, respectively—i.e., a $p^+n$ or an $n^+p$ junction, respectively. The p-n junction intersects the surface of the body at a location where the body is coated with an insulating layer. Degradation is believed to be caused by damage produced in the insulating layer by "hot" (fast-moving) charge carriers which are created in the region of relatively low impurity concentration, particularly in the neighborhood of the intersection of the p-n junction with the surface of the body. Accordingly, because of the higher electric fields which are ordinarily present in smaller sized devices and which cause a more severe hot charge carrier problem, smaller sized devices tend to have lower operational lifetimes.

In U.S. Pat. No. 4,704,547 issued to H. Kirsch on Nov. 3, 1987, entitled "IGFET Gating Circuit Having Reduced Electric Field Degradation," it was taught that the degradation of MOS transistors due to hot carriers could be alleviated in complementary transistor logic gates by the technique of inserting an extra (protective) transistor between the p-channel and n-channel transistors. However, the technique of that patent requires the added transistor, which may be undesirable from the standpoints of speed performance and of consuming precious semiconductor surface area, particularly in complex logic circuits; and the technique may not be convenient to use in the context of circuits other than complementary transistor logic gates and the like.

Another technique for reducing MOS transistor degradation is the lightly doped drain (LDD), in which the concentration of conductivity-type determining impurities is reduced in a neighborhood of the drain. However, in this technique unwanted added series resistance in the drain outside the transistor channel is unavoidable, whereby the switching speed of the transistor is undesirably reduced, especially when the added resistance is comparable to the resistance of the channel itself, as is the case where the channel length is approximately 0.5 micrometer or less.

Yet another technique for coping with the hot carrier problem is a reduction in drain-source operating voltages. This technique, however, entails not only loss of speed but also a reduction in tolerable noise margins. Moreover, in case the channel length goes to approximately 0.5 micrometer or less, the reduction in drain-source operating voltages would present a serious obstacle to the use of Bipolar Complementary MOS (BiCMOS) circuits because of the higher minimum operating voltage requirements of the bipolar transistors in such circuits.

It would therefore be desirable to have a technique for reducing the rate of degradation (increase the operational lifetime) of MOS transistors, which does not suffer from the aforementioned problems.

SUMMARY OF THE INVENTION

The aforementioned problems in the prior art techniques for increasing the operating lifetime (reducing the rate of degradation) of a semiconductor device, incorporated in a semiconductor body at a major surface thereof and having a p-n junction which intersects the major surface, are alleviated by virtue of the introduction and presence of neutral impurities in a portion of the more lightly doped region contiguous with the intersection of the p-n junction with the surface of the semiconductor body—i.e., where detrimental hot charge carriers are formed. Typically an insulating layer, such as silicon dioxide, overlies the surface of the body at least at this intersection. For example, the device is a silicon MOS transistor, and the impurity is germanium. Advantageously, the neutral impurity region—i.e., the portion of the lightly doped region which contains the neutral impurities—extends at least along one-half, and preferably along the entire intersection, e.g., the entire width of the channel of an MOS transistor in a neighborhood of the drain, and it extends laterally beyond the drain into the channel. For example, the neutral impurity region contains a concentration of germanium of at least $3 \times 10^{17}$ per cubic centimeter. In any event, the neutral impurity region contains a concentration of neutral impurities which is higher than the concentration of conductivity-type determining impurities in the channel; and this neutral impurity region extends laterally beyond the metallurgical drain junction into the channel, at least along the surface of the body, e.g., for a distance of at least about 0.01 micrometer in a silicon MOS transistor. In this way, the rate of degradation of semiconductor devices can be measurably decreased.

It is believed that this decrease in degradation is attributable—for example, in MOS transistors—to a prevention of the formation of hot charge carriers at or near the drain, or both, by virtue of scattering of the carriers by the neutral impurities. It is theorized that this scattering reduces the number of hot charge carriers that can penetrate to the insulating layer, where the hot carriers damage the insulating layer and degrade device performance. Because they are neutral, moreover, the added neutral impurities apparently do not significantly reduce the desirable mobility of charge carriers in the channel. However, it should be understood that the successful results obtained in this invention do not depend upon the correctness of any theory.

Advantageously, in order to ensure p-n junctions that are shallow, any required relatively high temperature annealing of the neutral (germanium) impurity region can be (but not necessarily) performed prior to implanting the conductivity-type determining impurity required to form the p-n junction (which thereafter generally requires a relatively low-temperature annealing).

BRIEF DESCRIPTION OF THE DRAWING

Only for the sake of clarity, none of the drawings is to scale. Elements in different FIGURES which are substantially the same are denoted by the same reference numerals.

DETAILED DESCRIPTION

Figure 1:
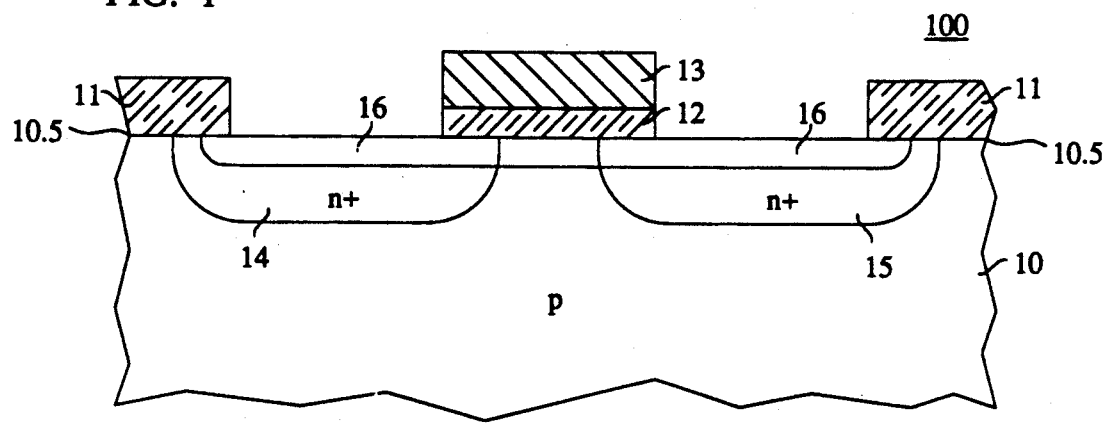
FIG. 1 is a cross-section diagram of an MOS transistor device in accordance with a specific embodiment of the invention.

As shown in FIG. 1 an n-channel MOS transistor device structure 100 includes a portion 10 of a p-type silicon semiconductor body. Upon a top major surface 10.5 of this body 10 are located a relatively thick field oxide layer 11 and a thin gate oxide layer 12. Typically this gate oxide layer 12 has a thickness of about 12 nanometer or less for a channel length (gate oxide length) of about 0.8 micrometer or less. Upon the gate oxide layer 12 is located an n+ polycrystalline silicon gate electrode 13, as known in the art. Source and drain regions 14 and 15, respectively, are of n+ type conductivity, typically as formed by ion implantation of 80 keV arsenic followed by annealing, typically at about 900 degrees C. for about 10 minutes. Metal or metal silicide source and drain electrodes (not shown) are typically attached to the respective surfaces of the source and drain regions, to complete the transistor device 100 and to supply it with electrical access to the rest of the circuit (not shown) integrated in the silicon body.

As thus far described, the transistor device structure 100 is quite conventional. In accordance with this embodiment (FIG. 1) of the invention, however, the device structure 100 further comprises a neutral impurity region in the form of a germanium doped region 16 formed prior to definition or formation of the gate electrode 13 but subsequent to the formation and patterning of the field oxide 11. At that stage, the germanium region is formed, by example, by implantation with two doses of germanium ions, one having an energy of 25 keV and the other having an energy of 110 keV, using a standard source of germanium ions. Annealing is then performed at a temperature of about 950 degrees C., typically for approximately 30 to 60 minutes. Preferably, however, to ensure shallow source and drain junctions, this annealing of the germanium region, which is performed advantageously for a longer time or at a higher temperature (or both) than the annealing of the arsenic at the source and drain, is performed prior to formation—as by the arsenic implantation—of the source and drain region. Because of the relatively low diffusivity of germanium in silicon, this annealing does not significantly change the depth of the germanium doped region 16.

In another embodiment (FIG. 2) of the invention, an MOS transistor device structure 200 has a similar structure to that of the previously described transistor device 100 except the germanium is implanted subsequent to the formation of the gate, and either prior or subsequent to the formation of the source and drain regions 14 and 15; and, in addition to the 25 keV and 110 keV doses of germanium used for the previously described structure 100, a dose of 160 keV (or higher) germanium is implanted into the body 10 in order to ensure that a portion of the germanium region 26 extends outside the metallurgical p-n junction 25 of the drain region 15 laterally into and substantially all the way across the width of the channel (at the surface 10.5 underneath the gate oxide layer 12), where it can suppress hot charge carrier formation. Again, an annealing of the germanium region preferably is performed prior to source and drain implantation.

In yet another embodiment (FIG. 3) of the invention an MOS transistor device structure 300 has a similar structure to that of the previously described device structure 200 except for the presence of a side-wall oxide (or other insulator) layer 32. The implantation of arsenic to form the source and drain regions is performed subsequent to side-wall oxide formation; whereas the implantation of the germanium to form the germanium doped region 36 is performed prior to side-wall oxide layer formation, in order to ensure that a portion of the germanium region 36 extends outside the drain region 15 laterally into (and across) the channel. In view of the offset of the drain region 15 relative to the germanium doped region 36 caused by the side-wall oxide formation, there is no need for a 160 keV germanium dose in addition to the 25 and 110 keV doses. Again, preferably an annealing of the germanium region is performed prior to the implantation of the source and drain regions.

Figure 2:
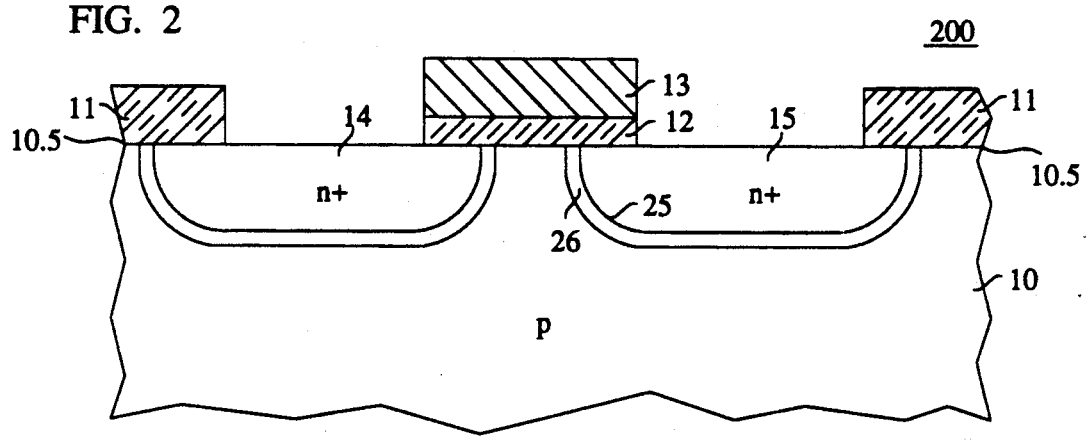
FIG. 2 is a cross-section diagram of an MOS transistor device in accordance with another specific embodiment of the invention.
Figure 3:
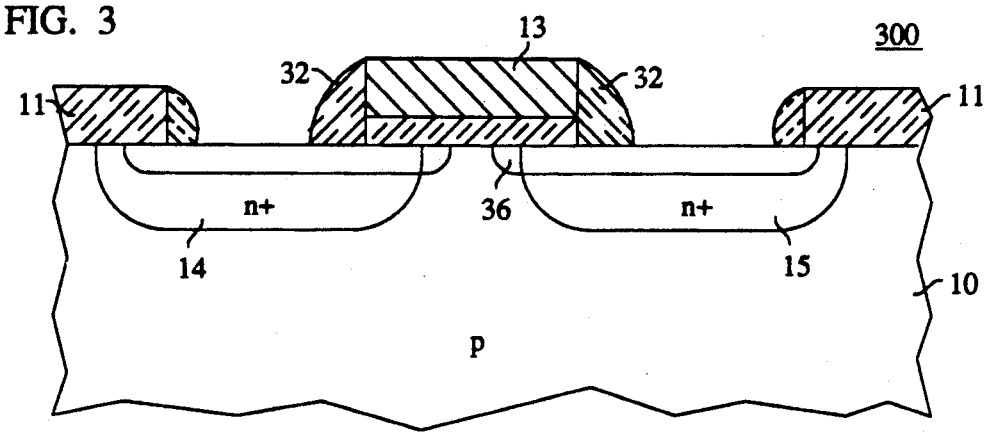
FIG. 3 is a cross-section diagram of an MOS transistor device in accordance with yet another specific embodiment of the invention.

Transistor devices of the kind shown in FIGS. 1, 2, and 3 have been fabricated and successfully tested, and the implantations of germanium to concentration in the approximate range of $3 \times 10^{17}$ to $1 \times 10^{20}$ (3E17 to 1E20) per cubic centimeter have resulted in significant improvements (reductions) in the rate of degradation of the transconductance. More specifically, to obtain the germanium concentration of 3E17 per cubic centimeter, a dose of 1E12 per square centimeter of 25 keV germanium ions plus a dose of 3E12 per square centimeter of 110 keV germanium ions (plus a dose of 3E12 per square centimeter of 160 keV germanium ions in the case of the structure 200) can be used. To obtain the germanium concentration of 1E20 per cubic centimeter, a dose of 3E14 per square centimeter of 25 keV germanium ions plus a dose of 1E15 per square centimeter of 110 keV germanium ions can be used. It should be noted that doses of germanium in an amount above about 3E19 per cubic centimeter produce amorphous silicon; doses below that amount produce damaged silicon. Higher germanium concentration than 1E20 per cubic centimeter may prove to be useful in conjunction with higher annealing temperatures. It should be noted, however, that experiments performed thus far on structures of the kind shown in FIG. 1 have indicated that the germanium concentration in this kind of structure (but not in structures like 200 and 300) should be limited to not more than 1E19 per cubic centimeter.

Although the invention has been described in terms of specific embodiments, various modifications can be made without departing from the scope of the invention. For example, the polysilicon gate can be a p+ polysilicon or a metal gate, instead of a n+ polysilicon gate. Moreover, in addition to n-channel transistors, p-channel silicon MOS transistors similarly can benefit from neutral impurity (germanium) regions in the neighborhood of the drain junction. Also both p-channel and n-channel transistor devices can be interconnected and integrated in the same silicon body, as known in the complementary MOS (CMOS) integrated circuit art, with either or both of these types of devices having the neutral germanium impurity regions described above, to reduce the rate of device degradation. In addition, MOS transistor devices of this invention can be interconnected and integrated with bipolar transistors in the same semiconductor body.

Also, a single annealing step can be used to repair simultaneously both the germanium and the arsenic damage at a temperature and for a time sufficient for repairing the damage due to the germanium implantation. However, in the case of fabricating a device of the kind shown in FIG. 2, the parameters of such a single annealing step must be carefully adjusted to ensure that in the device 200 the germanium region 26 extends beyond the metallurgical p-n junction 25 into the p-type silicon body 10 everywhere in a neighborhood of at least one-half the intersection of the metallurgical p-n junction 25 with the surface 10.5, such neighborhood thus extending laterally beyond the junction into the channel for a distance advantageously equal to at least approximately 0.01 micrometer.

Instead of ion implantation, other methods can be used for obtaining a germanium region in silicon, such as epitaxially growing germanium-doped-silicon (silicon doped with germanium). Moreover, instead implanting ions of germanium, other neutral impurities—i.e., that do not change the electric field distribution—can be used, such as ions of carbon, the noble gases, tin, silicon, indium, or lead. Finally instead of silicon MOS transistors, other semiconductor devices, such as bipolar transistors, or diodes that suffer from hot carrier degradation can be used in conjunction with the neutral impurity regions of this invention. In the case of such bipolar transistors or diodes, advantageously the neutral impurity region encompasses the regions of the devices where detrimental hot carriers are formed, particularly at or near (or both) an intersection of a p-n junction with a semiconductor surface.

We claim:

1. In an integrated circuit incorporated at a major surface of semiconductor body, a device comprising a p-n junction which intersects the surface of the semiconductor body, the junction being formed by the interface of first and second regions of the semiconductor body, the first and second regions having first and second conductivity types, respectively, owing to respective first and second concentrations of conductivity-type determining impurities of the first and second types, the first concentration at the p-n junction being higher than the second thereat, the improvement being that a portion of the second region which is contiguous with at least one-half the intersection of the p-n junction with the surface of the semiconductor body everywhere contains a concentration of neutral impurities which is at least as high as the second concentration in the second region at the intersection of the p-n junction with the surface of the semiconductor body.

2. In an integrated circuit, the device of claim 1 in which the portion of the second region laterally extends, at the surface of the body from the intersection of the junction into the second region, for a distance of at least 0.01 micrometer.

3. In an integrated circuit, the device of claim 1 in which the first region of the device is the drain region of an MOS transistor, and in which the portion of the second region is contiguous with substantially the entire intersection of the p-n junction with the surface of the body.

4. In an integrated circuit, the device of claim 1 in which the first region of the device is the drain region of a silicon MOS transistor device having a channel contiguous with the drain region, in which the concentration of neutral impurities is at least $3 \times 10^{17}$ germanium atoms or ions per cubic centimeter, and in which such concentration extends laterally beyond the drain region into the channel for a distance of at least 0.01 micrometers.

5. In an integrated circuit, the device of claim 4 in which an insulator layer overlies the surface of the body where the p-n junction intersects it.

6. In an integrated circuit, the device of claim 3 in which an insulator layer overlies the surface of the body where the p-n junction intersects it.

7. An integrated circuit comprising the device recited claim 1 in which an insulator layer overlies the surface of the body where the p-n junction intersects it.

8. An integrated circuit according to claim 4 in which the first region is n-type conductivity.

9. An integrated circuit according to claim 1 in which the first region is n-type conductivity.

* * * * *